(12) United States Patent
Yang

(10) Patent No.: US 10,281,758 B2
(45) Date of Patent: May 7, 2019

(54) LTPS ARRAY SUBSTRATE AND METHOD FOR MANUFACTURING THE SAME

(71) Applicant: WUHAN CHINA STAR OPTOELECTRONICS TECHNOLOGY CO., LTD., Wuhan, Hubei (CN)

(72) Inventor: Chengao Yang, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/578,109

(22) PCT Filed: Jun. 9, 2017

(86) PCT No.: PCT/CN2017/087785
§ 371 (c)(1),
(2) Date: Nov. 29, 2017

(87) PCT Pub. No.: WO2018/196112
PCT Pub. Date: Nov. 1, 2018

(65) Prior Publication Data
US 2018/0356664 A1    Dec. 13, 2018

(51) Int. Cl.
*G06F 3/044*    (2006.01)
*G02F 1/1333*    (2006.01)
(Continued)

(52) U.S. Cl.
CPC .... *G02F 1/13338* (2013.01); *G02F 1/134309* (2013.01); *G06F 3/044* (2013.01);
(Continued)

(58) Field of Classification Search
CPC ........ G06F 3/041–3/0416; G06F 3/044; G06F 2203/04103; G06F 2203/04105;
(Continued)

(56) References Cited

U.S. PATENT DOCUMENTS

2012/0218199 A1* 8/2012 Kim ...................... G06F 3/0412
345/173
2014/0049486 A1* 2/2014 Kim ........................ G06F 3/041
345/173
(Continued)

*Primary Examiner* — Nathan Danielsen
(74) *Attorney, Agent, or Firm* — Kirton McConkie; Evan R. Witt

(57) ABSTRACT

The present disclosure provides an LTPS array substrate, comprising: a substrate; a gate electrode insulating layer; an interlayer insulating layer; an organic layer; a plurality of pressure sensitive plates formed on the organic layer; a metal layer formed on the organic layer and has a pattern of a plurality of planar touch control signal lines and a plurality of touch pressure control signal lines, wherein the touch pressure control signal lines are connected to the pressure sensitive plates; a passivation layer, wherein a plurality of common electrode plates are formed in the passivation layer, and the planar touch control signal lines are connected to the common electrode plates via a plurality of touch control through-holes.

14 Claims, 4 Drawing Sheets

(51) Int. Cl.
    *H01L 27/20*     (2006.01)
    *H01L 41/047*     (2006.01)
    *H01L 29/66*     (2006.01)
    *H01L 29/786*     (2006.01)
    *H01L 41/04*     (2006.01)
    *H01L 41/29*     (2013.01)
    *H01L 41/113*     (2006.01)
    *H01L 27/12*     (2006.01)
    *G02F 1/1343*     (2006.01)
    *G02F 1/1362*     (2006.01)
    *G02F 1/1368*     (2006.01)
    *G06F 3/041*     (2006.01)

(52) U.S. Cl.
    CPC .......... *H01L 27/124* (2013.01); *H01L 27/127* (2013.01); *H01L 27/1222* (2013.01); *H01L 27/1248* (2013.01); *H01L 27/1259* (2013.01); *H01L 27/1262* (2013.01); *H01L 27/20* (2013.01); *H01L 29/66757* (2013.01); *H01L 29/78633* (2013.01); *H01L 29/78675* (2013.01); *H01L 41/042* (2013.01); *H01L 41/0475* (2013.01); *H01L 41/1132* (2013.01); *H01L 41/29* (2013.01); *G02F 1/1368* (2013.01); *G02F 1/136286* (2013.01); *G02F 2001/13685* (2013.01); *G02F 2001/136295* (2013.01); *G02F 2202/104* (2013.01); *G06F 3/0412* (2013.01); *G06F 2203/04103* (2013.01); *G06F 2203/04105* (2013.01)

(58) Field of Classification Search
    CPC ... G09G 3/36–3/3696; G02F 1/134309; G02F 1/134336; G02F 1/136286; G02F 1/1368; G02F 2001/134318; G02F 2001/136295; G02F 2001/13685; G02F 2202/104; H01L 27/1222; H01L 27/124; H01L 27/1248; H01L 27/1259; H01L 27/1262; H01L 27/127; H01L 27/20; H01L 29/66757; H01L 29/78633; H01L 29/78675; H01L 41/042; H01L 41/075; H01L 41/1132; H01L 41/29

See application file for complete search history.

(56) References Cited

U.S. PATENT DOCUMENTS

| | | | | |
|---|---|---|---|---|
| 2014/0362000 | A1* | 12/2014 | Seo | G02F 1/13394 345/173 |
| 2016/0062504 | A1* | 3/2016 | Hwang | G06F 3/0412 345/174 |
| 2016/0306481 | A1* | 10/2016 | Filiz | G06F 3/0414 |
| 2017/0016930 | A1* | 1/2017 | Qiu | G01P 15/0802 |
| 2017/0220191 | A1* | 8/2017 | Liu | G06F 3/0412 |

* cited by examiner

LTPS ARRAY SUBSTRATE AND METHOD FOR MANUFACTURING THE SAME

FIELD OF THE DISCLOSURE

The present disclosure relates to the field of liquid crystal displaying techniques, and more particularly to a low temperature poly-silicon (LTPS) array substrate and a method for manufacturing the same.

BACKGROUND

Traditional non-smart cellphones have been replaced with the emergence of smart cellphones. Additionally, screen sizes of the cellphones are increasing. Operation of the cellphones has also changed from a traditional push-button mode to a touch pressure control mode. Thereafter, touch pressure control techniques are rapidly developing.

Touch pressure control is carried out by pressing a touch control panel of a cellphone or tablet computer. As surface of the touch control panel deforms, the deformation would cause variation of capacitance or resistance, which can be detected by a pressure sensor to achieve sensing of touch pressure. This technical scheme effectively achieves sensing of touch pressure. However, the touch control layer is integrated within the display panel, and it generates interference among touch control signals. Conventionally, to solve this problem, an add-on type structure for carrying out the touch pressure control is adopted. But, because there is an air layer at the upper side and the lower side of the pressure sensors, this makes lower sensitivity of touch pressure. Moreover, a new substrate has to be introduced into the process of producing the pressure sensors. However, addition of attaching times and additional flexible circuit boards both increase costs of manufacturing display panel. Also, after the pressure sensors are attached to the display panel, thickness and weight of the entire display module are increased, which does not allow for thin thickness and light weight sought by the cellphone and mobile working. It is not the most satisfactory technical scheme for carrying out touch pressure control.

In view of the foregoing, the conventionally-used add-on type of touch pressure control panel has a lower sensitivity of sensing touch pressure, and the manufacturing process thereof needs additional devices which increases the weight and thickness of the panel and makes it difficult to accomplish a built-in type of touch pressure control panel with high quality.

SUMMARY OF THE DISCLOSURE

The present disclosure provides an LTPS array substrate, which integrates the pressure sensors within the panel so as to solve the problems encountered by the conventionally-used add-on type of touch pressure control panel, where the conventionally-used add-on type of touch pressure control panel has a lower sensitivity of sensing touch pressure, and the manufacturing process thereof needs additional devices which increases the weight and thickness of the panel and makes it difficult to accomplish a built-in type of touch pressure control panel with high quality.

To solve the above-said problems, the present disclosure provides plural technical schemes as described below.

The present disclosure provides a low temperature poly-silicon (LTPS) array substrate, comprising:

a substrate;

a gate electrode insulating layer formed on a surface of the substrate;

an interlayer insulating layer formed on a surface of the gate electrode insulating layer;

an organic layer formed on a surface of the interlayer insulating layer;

a pressure sensitive layer formed on the organic layer, wherein the pressure sensitive layer is made of a piezoelectric material, and the pressure sensitive layer has a pattern of a plurality of pressure sensitive plates;

a metal layer formed on the organic layer, wherein the metal layer has a pattern of a plurality of planar touch control signal lines and a plurality of touch pressure control signal lines that are insulated from each other, and the touch pressure control signal lines are connected to the pressure sensitive plates;

a dielectric layer formed on a surface of the organic layer, wherein a plurality of touch control through-holes are formed on the dielectric layer;

a passivation layer formed on a surface of the dielectric layer, wherein a common electrode layer is formed in the passivation layer, the common electrode layer has a pattern of a plurality of common electrode plates, and the planar touch control signal lines are connected to the common electrode plates via the touch control through-holes;

wherein the organic layer comprises a first planarization layer and a second planarization layer formed on a surface of the first planarization layer, the pressure sensitive plates are disposed between the first planarization layer and the second planarization layer, a plurality of pressure sensitive through-holes are formed in the second planarization layer, and the pressure sensitive plates are connected to the touch pressure control signal lines via the pressure sensitive through-holes.

According to a preferred embodiment of the present disclosure, the common electrode layer comprises the common electrode plates in an array distribution, and each of the common electrode plates is correspondingly connected to one of the planar touch control signal lines; the pressure sensitive plates are formed in an array distribution on the organic layer, and each of the pressure sensitive plates is correspondingly connected to one of the touch pressure control signal lines.

According to a preferred embodiment of the present disclosure, each of the pressure sensitive plates is correspondingly disposed directly below one of the common electrode plates.

According to a preferred embodiment of the present disclosure, a light-shielding layer is formed in the substrate, a polycrystalline silicon layer is formed on the surface of the substrate, the polycrystalline silicon layer is formed, to include a plurality of channel areas as well as a plurality of source electrode doping areas and a plurality of drain electrode doping areas disposed at two sides of the channel areas, the gate electrode insulating layer is formed on the surface of the substrate, a plurality of gate electrodes and the interlayer insulating layer are formed on the surface of the gate electrode insulating layer, a plurality of source electrodes and a plurality of drain electrodes are formed on the surface of the interlayer insulating layer, the source electrodes are connected to the source electrode doping areas via a plurality of source electrode through-holes, the drain electrodes are connected to the drain electrode doping areas via a plurality of drain electrode through-holes, the passivation layer is formed on the surface of the dielectric layer, a plurality of pixel electrodes are formed on a surface of the passivation layer, and the pixel electrodes are connected to the drain electrodes via a plurality of pixel electrode through-holes.

According to a preferred embodiment of the present disclosure, both the common electrodes and the touch pressure control signal lines are a transparent metal electrode.

The present disclosure further provides another low temperature poly-silicon (LTPS) array substrate, comprising:
  a substrate;
  a gate electrode insulating layer formed on a surface of the substrate;
  an interlayer insulating layer formed on a surface of the gate electrode insulating layer;
  an organic layer formed on a surface of the interlayer insulating layer;
  a pressure sensitive layer formed on the organic layer, wherein the pressure sensitive layer is made of a piezoelectric material, and the pressure sensitive layer has a pattern of a plurality of pressure sensitive plates;
  a metal layer formed on the organic layer, wherein the metal layer has a pattern of a plurality of planar touch control signal lines and a plurality of touch pressure control signal lines that are insulated from each other, and the touch pressure control signal lines are connected to the pressure sensitive plates;
  a dielectric layer formed on a surface of the organic layer, wherein a plurality of touch control through-holes are formed on the dielectric layer;
  a passivation layer formed on a surface of the dielectric layer, wherein a common electrode layer is formed in the passivation layer, the common electrode layer has a pattern of a plurality of common electrode plates, and the planar touch control signal lines are connected to the common electrode plates via the touch control through-holes.

According to a preferred embodiment of the present disclosure, the common electrode layer comprises the common electrode plates in an array distribution, and each of the common electrode plates is correspondingly connected to one of the planar touch control signal lines; the pressure sensitive plates are formed in an array distribution on the organic layer, and each of the pressure sensitive plates is correspondingly connected to one of the touch pressure control signal lines.

According to a preferred embodiment of the present disclosure, each of the pressure sensitive plates is correspondingly disposed directly below one of the common electrode plates.

According to a preferred embodiment of the present disclosure, the pressure sensitive plates are formed on the surface of the organic layer, the touch pressure control signal lines are formed on a surface of the pressure sensitive plates, and the touch pressure control signal lines are connected to the pressure sensitive plates.

According to a preferred embodiment of the present disclosure, a light-shielding layer is formed in the substrate, a polycrystalline silicon layer is formed on the surface of the substrate, the polycrystalline silicon layer is formed to include a plurality of channel areas as well as a plurality of source electrode doping areas and a plurality of drain electrode doping areas disposed at two sides of the channel areas, the gate electrode insulating layer is formed on the surface of the substrate, a plurality of gate electrodes and the interlayer insulating layer are formed on the surface of the gate electrode insulating layer, a plurality of source electrodes and a plurality of drain electrodes are formed on the surface of the interlayer insulating layer, the source electrodes are connected to the source electrode doping areas via a plurality of source electrode through-holes, the drain electrodes are connected to the drain electrode doping areas via a plurality of drain electrode through-holes, the passivation layer is formed on the surface of the dielectric layer, a plurality of pixel electrodes are formed on a surface of the passivation layer, and the pixel electrodes are connected to the drain electrodes via a plurality of pixel electrode through-holes.

According to a preferred embodiment of the present disclosure, both the common electrodes and the touch pressure control signal lines are a transparent metal electrode.

The present disclosure further provides a method for manufacturing an LTPS array substrate, comprising:
  providing a substrate;
  forming a buffer layer on the substrate;
  forming a channel for each of a plurality of TFTs;
  forming a gate electrode insulating layer, a plurality of gate electrodes, and a plurality of scan lines on the substrate, wherein each of the gate electrodes is correspondingly connected to one of the scan lines;
  forming an interlayer insulating layer on the substrate, and forming a plurality of source electrode through-holes and a plurality of drain electrode through-holes on the interlayer insulating layer;
  depositing a first metal layer on the substrate, and patterning the first metal layer to form a plurality of source electrodes of the TFTs, a plurality of drain electrodes of the TFTs, and a plurality of data lines on the interlayer insulating layer; wherein the source electrodes are connected to one sides of the channels via the source electrode through-holes, and the drain electrodes are connected to the other sides of the channels via the drain electrode through-holes; wherein each of the source electrodes of the TFTs is correspondingly connected to one of the data lines;
  forming an organic layer on the substrate, and forming a pressure sensitive layer in the organic layer, and then forming a plurality of pressure sensitive through-holes on the organic layer; and patterning the pressure sensitive layer to form a plurality of pressure sensitive plates that are insulated from each other in the organic layer;
  depositing a second metal layer on the substrate, and patterning the second metal layer to form a plurality of planar touch control signal lines and a plurality of touch pressure control signal lines that are insulated from each other on the organic layer; wherein the touch pressure control signal lines are connected to the pressure sensitive plates via the pressure sensitive through-holes;
  forming a dielectric layer and a common electrode layer on the substrate, and forming a plurality of touch control through-holes on the dielectric layer; and patterning the common electrode layer to form a plurality of common electrode plates; wherein the planar touch control signal lines are connected to the common electrode plates via the touch control through-holes; and
  forming a passivation layer and a plurality of pixel electrodes, and forming a plurality of pixel electrode through-holes on the passivation layer, the dielectric layer, and the organic layer; wherein the pixel electrodes are connected to the drain electrodes via the pixel electrode through-holes.

According to a preferred embodiment of the present disclosure, forming an organic layer on the substrate, and forming a pressure sensitive layer in the organic layer, and then forming a plurality of pressure sensitive through-holes on the organic layer comprises:

forming a first planarization layer on the substrate, and forming the pressure sensitive layer on the first planarization layer;

forming a second planarization layer on the substrate, and forming the pressure sensitive through-holes on the second planarization layer.

According to a preferred embodiment of the present disclosure, both the planar touch control signal lines and the touch pressure control signal lines are a transparent metal electrode.

Compared to the conventionally-used touch pressure control panel, the present disclosure provides an LTPS array substrate with the function of touch pressure control. The present disclosure integrates the pressure sensors within the layered structure of the LTPS array substrate, making the distance between the pressure sensors and the glass cover plate of the display panel closer, and thus raising the sensitivity of sensing touch pressure. Besides, manufacturing of the touch pressure control plates is compatible with the planar touch control plates, avoiding interference among touch control signals in the panel. The problems of the conventionally-used add-on type of touch pressure control panel (such as a lower sensitivity of sensing touch pressure, and additional devices needed in the manufacturing process thereof which increases the weight and thickness of the panel and makes it difficult to accomplish a built-in type of touch pressure control panel with high quality.) can be solved.

BRIEF DESCRIPTION OF THE DRAWINGS

To detailedly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
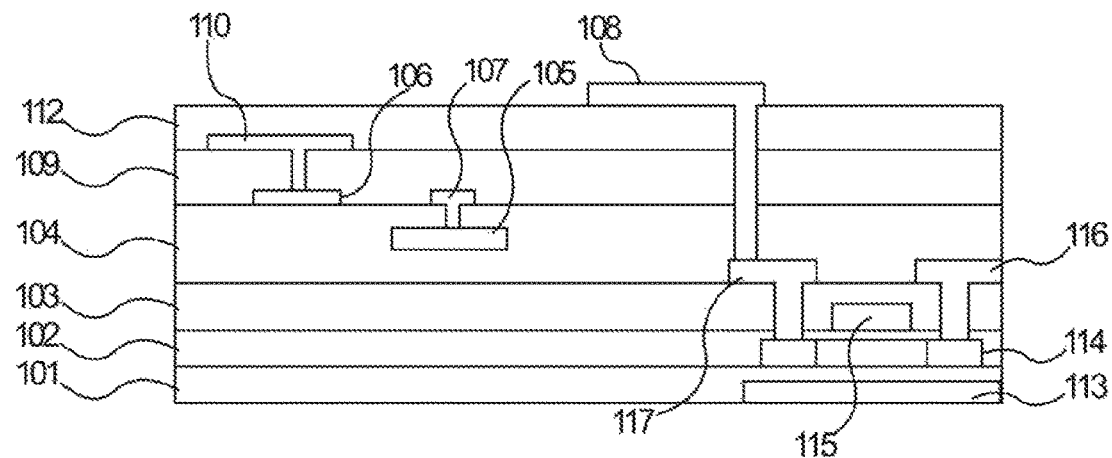
FIG. 1 shows a cross-sectional view of an LTPS array substrate according to an embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. Devices having similar structures in the drawings are represented by the same reference numeral.

The conventionally-used add-on type of touch pressure control panel has a lower sensitivity of sensing touch pressure, and the manufacturing process thereof needs additional devices which increases weight and thickness of panels and makes it difficult to accomplish a built-in high quality touch pressure control panel. The embodiments of the present disclosure can solve such problems.

Please refer to FIG. 1 which shows a cross-sectional view of an LTPS array substrate according to an embodiment of the present disclosure.

As shown in FIG. 1, the present disclosure provides an LTPS array substrate, including: a substrate 101; a gate electrode insulating layer 102 formed on a surface of the substrate 101; an interlayer insulating layer 103 formed on a surface of the gate electrode insulating layer 102; an organic layer 104 formed on a surface of the interlayer insulating layer 103.

A pressure sensitive layer is formed on the organic layer 104. The pressure sensitive layer is made of a piezoelectric material, and the pressure sensitive layer is patterned to form a plurality of pressure sensitive plates 105.

A metal layer is formed on the organic layer 104, where the metal layer is patterned to form a plurality of planar touch control signal lines 106 and a plurality of touch pressure control signal lines 107 that are insulated from each other, and the touch pressure control signal lines 107 are connected to the pressure sensitive plates 105. A dielectric layer 109 is formed on a surface of the organic layer 104, where a plurality of touch control through-holes are formed on the dielectric layer 109.

A passivation layer 112 is formed on a surface of the dielectric layer 109, where a metal layer, used as a common electrode, is formed in the passivation layer 112. The metal layer, used as the common electrode, is patterned to form a plurality of common electrode plates 110, and the planar touch control signal lines 106 are connected to the common electrode plates 110 via the touch control through-holes.

The piezoelectric material, used for the pressure sensitive plates, 105 refers to a crystalline material, which under pressure, will generate a voltage at two side surfaces. The piezoelectric material can generate an electric field in response to mechanical deformation, and can cause mechanical deformation in response to an electric field. If a pressure is exerted on the piezoelectric material, a potential difference would be produced (i.e., the direct piezoelectric effect). On the other hand, if a voltage is applied thereto, a mechanical stress would be produced (i.e., the converse piezoelectric effect).

The touch pressure control signal lines 107 and the pressure sensitive plates 105 constitute a pressure sensitive touch control panel. Once a finger presses the outer protective glass of the display, the display panel is deformed, and thus the pressure sensitive plates 105 are deformed. An electrical signal is generated in the direction where the panel is under pressure. At the pressure sensing point which corresponds to the site on which the finger touches the panel, an electrical current is detected. The electrical current is input to a control end via the touch pressure control signal lines 107, making the corresponding location at the panel to execute corresponding functional feedback.

The planar touch control signal lines 106 and the common electrode plates 110 constitute a planar touch control panel for implementing operation of planar touch control on the panel. Once a finger touches the panel, variation of capacitance of the common electrode plates 110 is detected. With the signal transmitted to a control end via the planar touch control signal lines 106, the function of planar touch control can be achieved. At the same time, the common electrode plates 110 are used with the pixel electrodes on the LTPS array substrate to form the storage capacitors.

By forming the touch pressure control signal lines 107 and the planar touch control signal lines 106 in the same layer, only one photo-mask is needed. Therefore, no additional metal lines are required in deploying signal lines for the pressure sensitive plates 105, the manufacturing process can be simplified, and the cost for making changes in the process can be reduced. Moreover, the touch pressure control signal lines 107 and the planar touch control signal lines 106 are insulated from each other, avoiding interference between the touch pressure control signal lines and the planar touch control signal lines.

The common electrode layer includes the common electrode plates 110 in an array distribution, and each of the common electrode plates 110 is correspondingly connected to one of the planar touch control signal lines 106. The common electrode plates 110 are insulated from each other, and each of the planar touch control signal lines 106 is correspondingly connected to one of the common electrode plates 110, therefore each of the common electrode plates 110 can simultaneously and independently generate the planar touch control signals, and thus multi-point planar touch control can be achieved.

The pressure sensitive plates 105 are formed in an array distribution on the organic layer 104, and each of the pressure sensitive plates 105 is correspondingly connected to one of the touch pressure control signal lines 107, therefore each of the pressure sensitive plates 105 can simultaneously and independently generate the touch pressure control signals, and thus multi-point touch pressure control can be achieved.

Each of the pressure sensitive plates 105 is correspondingly disposed below one of the common electrode plates 110. and each of the pressure sensitive plates 105 has a size of 3 mm×4 mm with the distance between adjacent pressure sensitive plates equal to 2.5 μm.

Further, a light-shielding layer 113 is formed in the substrate 101. A polycrystalline silicon layer 114 is formed on the surface of the substrate 101, where the polycrystalline silicon layer 114 is formed to include a plurality of channel areas as well as a plurality of source electrode doping areas and a plurality of drain electrode doping areas disposed at two sides of the channel areas. The gate electrode insulating layer 102 is formed on the surface of the substrate 101. A plurality of gate electrodes 115 and the interlayer insulating layer 103 are formed on the surface of the gate electrode insulating layer 102. A plurality of source electrodes 116 and a plurality of drain electrodes 117 are formed on the surface of the interlayer insulating layer 103. The source electrodes 116 are connected to the source electrode doping areas via a plurality of source electrode through-holes. The drain electrodes 117 are connected to the drain electrode doping areas via a plurality of drain electrode through-holes. The passivation layer 112 is formed on the surface of the dielectric layer 109. A plurality of pixel electrodes 108 are formed on a surface of the passivation layer 112. The pixel electrodes 108 are connected to the drain electrodes 117 via a plurality of pixel electrode through-holes.

The pressure sensitive layer can be disposed in the organic layer 104. For example, the organic layer 104 comprises a first planarization layer and a second planarization layer formed on a surface of the first planarization layer, the pressure sensitive plates are disposed between the first planarization layer and the second planarization layer, a plurality of pressure sensitive through-holes are formed in the second planarization layer, and the pressure sensitive plates 105 are connected to the touch pressure control signal lines 107 via the pressure sensitive through-holes. As such, by forming the pressure sensitive layer in the organic layer 104, the issue that the signal lines are unintentionally connected to the pressure sensitive layer due to process tolerance, which further causes erroneous transmission of the signals and ineffective touch pressure control can be avoided.

Alternatively, the pressure sensitive layer can be disposed on the upper surface of the organic layer 104. For example, the pressure sensitive plates 105 are formed on the surface of the organic layer 104. The pressure sensing lines are formed on the surface of the pressure sensitive plates 105, and the pressure sensing lines are connected to the pressure sensitive plates 105. With this configuration, the pressure sensitive plates 105 is closer to the protective cover plate of the panel, the detection of pressure would be more sensitive, and the step for producing through-holes in the process can be omitted.

Figure 2:
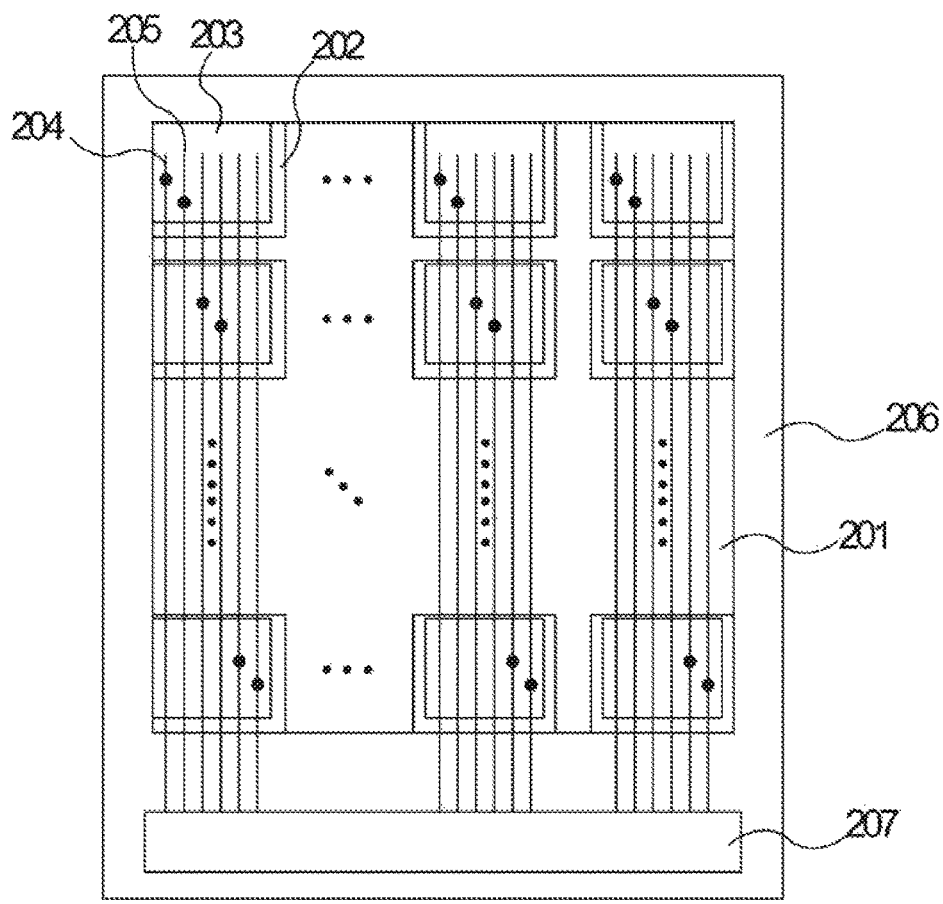
FIG. 2 shows a plan view of the planar touch control panel and the pressure sensitive touch control panel of an LTPS array substrate according to the present disclosure.

Please refer to FIG. 2 which shows a plan view of the planar touch control panel and the pressure sensitive touch control panel of an LTPS array substrate according to the present disclosure.

As shown in FIG. 2, the LTPS array substrate according to the present disclosure includes: a plurality of pressure sensitive plates 202, a plurality of common electrode plates 203, a plurality of planar touch control signal lines 204, and a plurality of touch pressure control signal lines 205 located in a displaying area 201 of the display panel, where the planar touch control signal lines 204 and the touch pressure control signal lines 205 are parallel to each other and are disposed in an alternative fashion; and a driver chip 207 located in a non-displaying area 206 of the display panel. The pressure sensitive plates 202 are disposed below the common electrode plates 203. Each of the pressure sensitive plates 202 is correspondingly connected to one of the touch pressure control signal lines 205. Each of the common electrode plates 203 is correspondingly connected to one of the planar touch control signal lines 204. The other end of each of the touch pressure control signal lines 205 is connected to a first region of the driver chip 207. The other end of each of the planar touch control signal lines 204 is connected to a second region of the driver chip 207.

Please refer to FIGS. 3A-3M which shows the steps in a method for manufacturing the LTPS array substrate according to an embodiment of the present disclosure.

The method for manufacturing an LTPS array substrate according to the present disclosure includes the following steps.

Figure 3A:
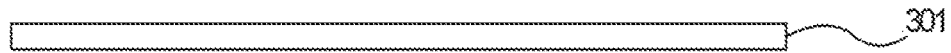
FIGS. 3A-3M shows the steps in a method for manufacturing the LTPS array substrate according to an embodiment of the present disclosure.

As shown in FIG. 3A, a substrate 301 is provided.

Figure 3B:

As shown in FIG. 3B, a light-shielding layer 302 is formed at the location corresponding to the thin-film transistors (TFTs).

Figure 3C:
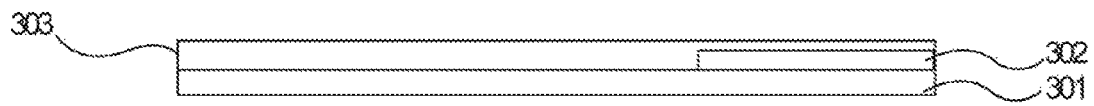

As shown in FIG. 3C, a buffer layer is formed on the substrate to cover the light-shielding layer 302.

Figure 3D:
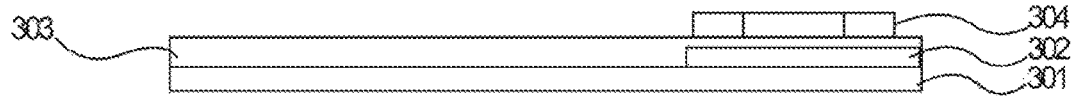

As shown in FIG. 3D, a polycrystalline silicon layer 304 is formed on the substrate 301, and ion implantation into the polycrystalline silicon layer 304 is performed to form a channel area as well as a source electrode doping area and a drain electrode doping area for each of the TFTs.

Figure 3E:
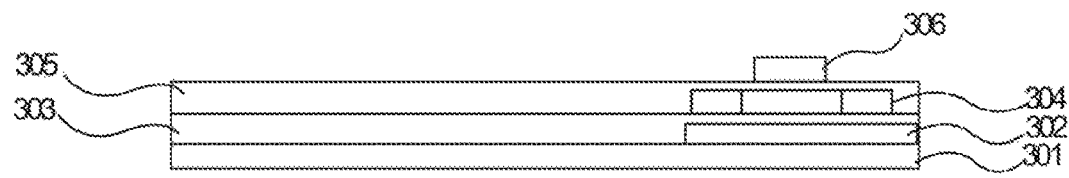

As shown in FIG. 3E, a gate electrode insulating layer 305, a plurality of gate electrodes 306, and a plurality of scan lines are formed on the substrate 301, where each of the gate electrodes 306 is correspondingly connected to one of the scan lines.

Figure 3F:
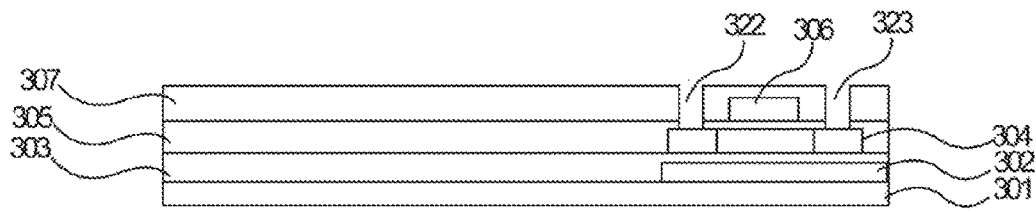

As shown in FIG. 3F, an interlayer insulating layer 307 is formed on the substrate 301, and a plurality of source electrode through-holes 322 and a plurality of drain electrode through-holes 323 are formed on the interlayer insulating layer 307.

Figure 3G:
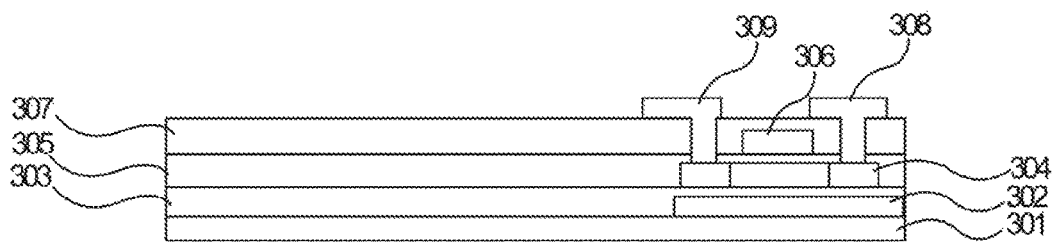

As shown in FIG. 3G, a first metal layer is deposited on the substrate 301, and the first metal layer is patterned to form a plurality of source electrodes 308 of the TFTs, a plurality of drain electrodes 309 of the TFTs, and a plurality of data lines. The source electrodes 308 are connected to one sides of the channels via the source electrode through-holes 323, and the drain electrodes 309 are connected to the other sides of the channels via the drain electrode through-holes 322, where each of the source electrodes 308 of the TFTs is correspondingly connected to one of the data lines.

Figure 3H:
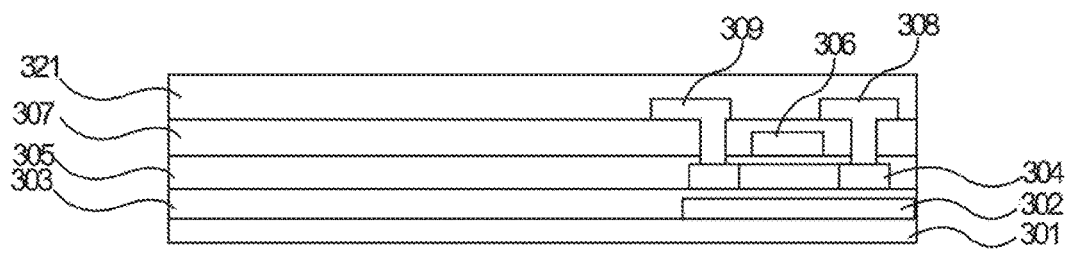

As shown in FIG. 3H, a first planarization layer 321 is formed on the substrate 301.

Figure 3I:
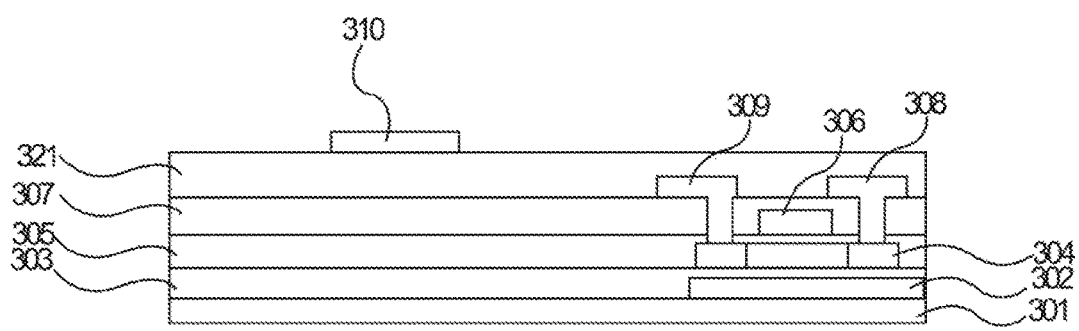

As shown in FIG. 3I, a pressure sensitive layer is formed on the substrate 301, and the pressure sensitive layer is patterned to form a plurality of pressure sensitive platers 310 on the surface of the first planarization layer 321.

Figure 3J:
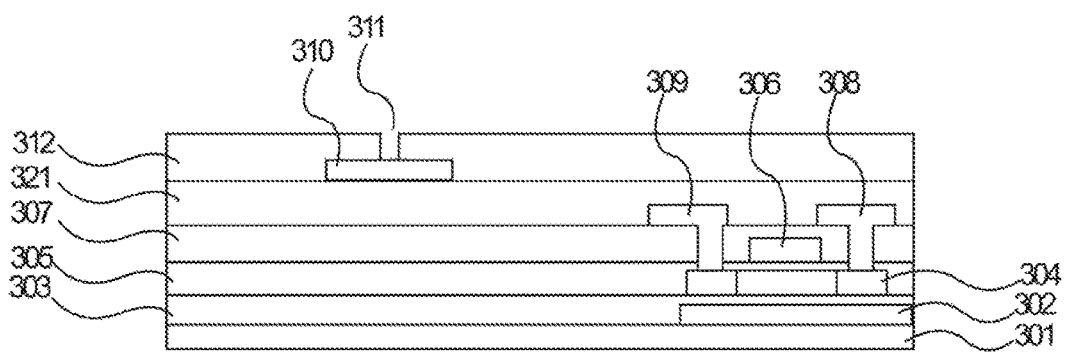

As shown in FIG. 3J, a second planarization layer 312 is deposited on the substrate 301, and a plurality of pressure sensitive through-holes 311 are formed on the pressure sensitive platers 310.

Figure 3K:
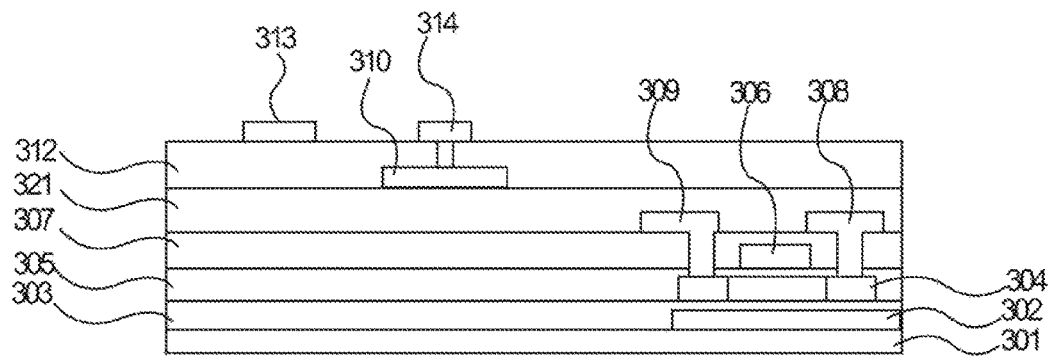

As shown in FIG. 3K, a second metal layer is deposited on the substrate 301, and the second metal layer is patterned to form a plurality of planar touch control signal lines 313 and a plurality of touch pressure control signal lines 314 that are insulated from each other on the second planarization layer 312, where the touch pressure control signal lines 314 are connected to the pressure sensitive plates 310 via the pressure sensitive through-holes 311.

Figure 3L:
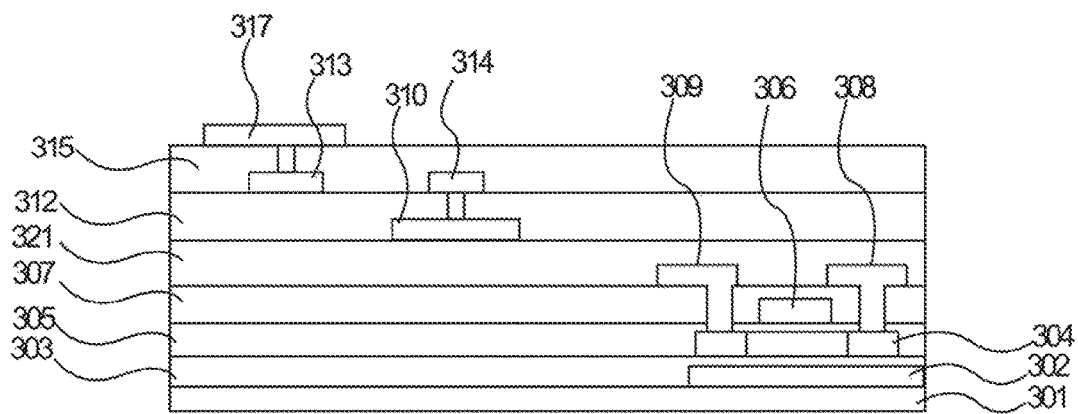

As shown in FIG. 3L, a dielectric layer 315 and a common electrode layer are formed on the substrate 301, and a plurality of touch control through-holes 316 are formed on the dielectric layer 315. By patterning the common electrode layer, a plurality of common electrode plates 317 are formed, where the planar touch control signal lines 313 are connected to the common electrode plates 317 via the touch control through-holes 316.

Figure 3M:
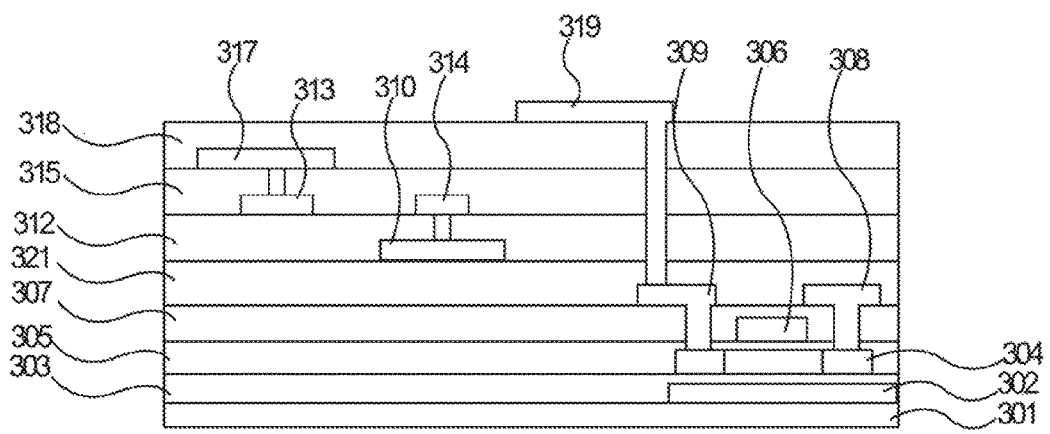

As shown in FIG. 3M, a passivation layer 318 and a plurality of pixel electrodes 319 are formed on the substrate 301, and a plurality of pixel electrode through-holes are formed on the passivation layer 318, the dielectric layer 315, and the organic layer. The pixel electrodes 319 are connected to the drain electrodes 309 via the pixel electrode through-holes.

The LTPS array substrate is thus formed, as shown in FIG. 3M.

In summary, while the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:
1. A low temperature poly-silicon (LTPS) array substrate, comprising:
   a substrate;
   a gate electrode insulating layer formed on a surface of the substrate;
   an interlayer insulating layer formed on a surface of the gate electrode insulating layer;
   an organic layer formed on a surface of the interlayer insulating layer;
   a pressure sensitive layer formed on the organic layer, wherein the pressure sensitive layer is made of a piezoelectric material, and the pressure sensitive layer has a pattern of a plurality of pressure sensitive plates;
   a metal layer formed on the organic layer, wherein the metal layer has a pattern of a plurality of planar touch control signal lines and a plurality of touch pressure control signal lines that are insulated from each other, and the touch pressure control signal lines are connected to the pressure sensitive plates;
   a dielectric layer formed on a surface of the organic layer, wherein a plurality of touch control through-holes are formed on the dielectric layer;
   a passivation layer formed on a surface of the dielectric layer, wherein a common electrode layer is formed in the passivation layer, the common electrode layer has a pattern of a plurality of common electrode plates, and the planar touch control signal lines are connected to the common electrode plates via the touch control through-holes;
   wherein the organic layer comprises a first planarization layer and a second planarization layer formed on a surface of the first planarization layer, the pressure sensitive plates are disposed between the first planarization layer and the second planarization layer, a plurality of pressure sensitive through-holes are formed in the second planarization layer, and the pressure sensitive plates are connected to the touch pressure control signal lines via the pressure sensitive through-holes.

2. The LTPS array substrate according to claim 1, wherein the common electrode layer comprises the common electrode plates in an array distribution, and each of the common electrode plates is correspondingly connected to one of the planar touch control signal lines;
   the pressure sensitive plates are formed in an array distribution on the organic layer, and each of the pressure sensitive plates is correspondingly connected to one of the touch pressure control signal lines.

3. The LTPS array substrate according to claim 2, wherein each of the pressure sensitive plates is correspondingly disposed directly below one of the common electrode plates.

4. The LTPS array substrate according to claim 1, wherein a light-shielding layer is formed in the substrate, a polycrystalline silicon layer is formed on the surface of the substrate, the polycrystalline silicon layer is formed, to include a plurality of channel areas as well as a plurality of source electrode doping areas and a plurality of drain electrode doping areas disposed at two sides of the channel areas, the gate electrode insulating layer is formed on the surface of the substrate, a plurality of gate electrodes and the interlayer insulating layer are formed on the surface of the gate electrode insulating layer, a plurality of source electrodes and a plurality of drain electrodes are formed on the surface of the interlayer insulating layer, the source electrodes are connected to the source electrode doping areas via a plurality of source electrode through-holes, the drain electrodes are connected to the drain electrode doping areas via a plurality of drain electrode through-holes, the passivation layer is formed on the surface of the dielectric layer, a plurality of pixel electrodes are formed on a surface of the passivation layer, and the pixel electrodes are connected to the drain electrodes via a plurality of pixel electrode through-holes.

5. The LTPS array substrate according to claim 1, wherein both the planar touch control signal lines and the touch pressure control signal lines are a transparent metal electrode.

6. A low temperature poly-silicon (LTPS) array substrate, comprising:
a substrate;
a gate electrode insulating layer formed on a surface of the substrate;
an interlayer insulating layer formed on a surface of the gate electrode insulating layer;
an organic layer formed on a surface of the interlayer insulating layer;
a pressure sensitive layer formed on the organic layer, wherein the pressure sensitive layer is made of a piezoelectric material, and the pressure sensitive layer has a pattern of a plurality of pressure sensitive plates;
a metal layer formed on the organic layer, wherein the metal layer has a pattern of a plurality of planar touch control signal lines and a plurality of touch pressure control signal lines that are insulated from each other, and the touch pressure control signal lines are connected to the pressure sensitive plates;
a dielectric layer formed on a surface of the organic layer, wherein a plurality of touch control through-holes are formed on the dielectric layer;
a passivation layer formed on a surface of the dielectric layer, wherein a common electrode layer is formed in the passivation layer, the common electrode layer has a pattern of a plurality of common electrode plates, and the planar touch control signal lines are connected to the common electrode plates via the touch control through-holes.

7. The LTPS array substrate according to claim 6, wherein the common electrode layer comprises the common electrode plates in an array distribution, and each of the common electrode plates is correspondingly connected to one of the planar touch control signal lines;
the pressure sensitive plates are formed in an array distribution on the organic layer, and each of the pressure sensitive plates is correspondingly connected to one of the touch pressure control signal lines.

8. The LTPS array substrate according to claim 7, wherein each of the pressure sensitive plates is correspondingly disposed directly below one of the common electrode plates.

9. The LTPS array substrate according to claim 6, wherein the pressure sensitive plates are formed on the surface of the organic layer, the touch pressure control signal lines are formed on a surface of the pressure sensitive plates, and the touch pressure control signal lines are connected to the pressure sensitive plates.

10. The LTPS array substrate according to claim 6, wherein a light-shielding layer is formed in the substrate, a polycrystalline silicon layer is formed on the surface of the substrate, the polycrystalline silicon layer is formed to include a plurality of channel areas as well as a plurality of source electrode doping areas and a plurality of drain electrode doping areas disposed at two sides of the channel areas, the gate electrode insulating layer is formed on the surface of the substrate, a plurality of gate electrodes and the interlayer insulating layer are formed on the surface of the gate electrode insulating layer, a plurality of source electrodes and a plurality of drain electrodes are formed on the surface of the interlayer insulating layer, the source electrodes are connected to the source electrode doping areas via a plurality of source electrode through-holes, the drain electrodes are connected to the drain electrode doping areas via a plurality of drain electrode through-holes, the passivation layer is formed on the surface of the dielectric layer, a plurality of pixel electrodes are formed on a surface of the passivation layer, and the pixel electrodes are connected to the drain electrodes via a plurality of pixel electrode through-holes.

11. The LTPS array substrate according to claim 6, wherein both the planar touch control signal lines and the touch pressure control signal lines are a transparent metal electrode.

12. A method for manufacturing a low temperature poly-silicon (LIPS) array substrate, comprising:
providing a substrate;
forming a buffer layer on the substrate;
forming a channel for each of a plurality of TFTs;
forming a gate electrode insulating layer, a plurality of gate electrodes, and a plurality of scan lines on the substrate,
wherein each of the gate electrodes is correspondingly connected to one of the scan lines;
forming an interlayer insulating layer on the substrate, and forming a plurality of source electrode through-holes and a plurality of drain electrode through-holes on the interlayer insulating layer;
depositing a first metal layer on the substrate, and patterning the first metal layer to form a plurality of source electrodes of the TFTs, a plurality of drain electrodes of the TFTs, and a plurality of data lines on the interlayer insulating layer;
wherein the source electrodes are connected to one sides of the channels via the source electrode through-holes, and the drain electrodes are connected to the other sides of the channels via the drain electrode through-holes;
wherein each of the source electrodes of the TFTs is correspondingly connected to one of the data lines;
forming an organic layer on the substrate, and forming a pressure sensitive layer in the organic layer, and then forming a plurality of pressure sensitive through-holes on the organic layer; and
patterning the pressure sensitive layer to form a plurality of pressure sensitive plates that are insulated from each other in the organic layer;
depositing a second metal layer on the substrate, and patterning the second metal layer to form a plurality of planar touch control signal lines and a plurality of touch pressure control signal lines that are insulated from each other on the organic layer;
wherein the touch pressure control signal lines are connected to the pressure sensitive plates via the pressure sensitive through-holes;
forming a dielectric layer and a common electrode layer on the substrate, and forming a plurality of touch control through-holes on the dielectric layer; and
patterning the common electrode layer to form a plurality of common electrode plates;
wherein the planar touch control signal lines are connected to the common electrode plates via the touch control through-holes; and
forming a passivation layer and a plurality of pixel electrodes, and forming a plurality of pixel electrode through-holes on the passivation layer, the dielectric layer, and the organic layer;
wherein the pixel electrodes are connected to the drain electrodes via the pixel electrode through-holes.

13. The method for manufacturing an LTPS array substrate according to claim 12, wherein forming an organic layer on the substrate, and forming a pressure sensitive layer in the organic layer, and then forming a plurality of pressure sensitive through-holes on the organic layer comprises:
    forming a first planarization layer on the substrate, and forming the pressure sensitive layer on the first planarization layer;
    forming a second planarization layer on the substrate, and forming the pressure sensitive through-holes on the second planarization layer.

14. The method for manufacturing an LTPS array substrate according to claim 12, wherein both the planar touch control signal lines and the touch pressure control signal lines are a transparent metal electrode.

* * * * *